US008132040B1

(12) United States Patent
Bartel

(10) Patent No.: US 8,132,040 B1
(45) Date of Patent: Mar. 6, 2012

(54) CHANNEL-TO-CHANNEL DESKEW SYSTEMS AND METHODS

(75) Inventor: Robert Bartel, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1139 days.

(21) Appl. No.: 11/924,088

(22) Filed: Oct. 25, 2007

(51) Int. Cl.
*G01R 35/00* (2006.01)

(52) U.S. Cl. ........ 713/503; 713/500; 713/501; 713/502; 713/600; 713/601; 713/400; 713/401; 324/202; 324/601; 702/85

(58) Field of Classification Search .................. 713/400, 713/401, 500–503, 600–601; 324/202, 601; 702/85
See application file for complete search history.

(56) References Cited

U.S. PATENT DOCUMENTS

| | | | |
|---|---|---|---|
| 5,563,592 A | 10/1996 | Cliff et al. | |
| 5,661,427 A | 8/1997 | McBride et al. | |
| 5,754,734 A | 5/1998 | Emeott et al. | |
| 5,768,372 A | 6/1998 | Sung et al. | |
| 5,794,033 A | 8/1998 | Aldebert | |
| 5,872,529 A | 2/1999 | Mejia | |
| 5,939,947 A | 8/1999 | Nakao et al. | |
| 6,028,445 A | 2/2000 | Lawman | |
| 6,038,185 A | 3/2000 | Ng et al. | |
| 6,044,025 A | 3/2000 | Lawman | |
| 6,172,528 B1 | 1/2001 | Malarsie | |
| 6,327,634 B1 | 12/2001 | Statovici | |
| 6,483,342 B2 | 11/2002 | Britton et al. | |
| 6,493,862 B1 | 12/2002 | Young et al. | |
| 6,507,214 B1 | 1/2003 | Snyder | |
| 6,507,943 B1 | 1/2003 | Kelem | |
| 6,525,678 B1 | 2/2003 | Veenstra et al. | |
| 6,563,387 B2 | 5/2003 | Hirano et al. | |
| 6,563,437 B1 | 5/2003 | Landry et al. | |
| 6,564,285 B1 | 5/2003 | Mills et al. | |
| 6,693,494 B2 | 2/2004 | Fan | |
| 6,700,446 B2 | 3/2004 | Ke | |
| 6,744,388 B1 | 6/2004 | Khu | |
| 6,772,230 B2 | 8/2004 | Chen et al. | |
| 6,785,165 B2 | 8/2004 | Kawahara | |
| 6,870,892 B2 * | 3/2005 | Strolle et al. .................. 375/347 |
| 6,885,227 B2 | 4/2005 | Agrawal et al. | |
| 6,903,574 B2 | 6/2005 | Chen et al. | |
| 7,019,577 B2 | 3/2006 | Agrawal et al. | |
| 7,034,599 B1 | 4/2006 | Agrawal et al. | |
| 7,038,508 B2 | 5/2006 | Parker et al. | |
| 7,424,650 B1 * | 9/2008 | Sivadasan et al. ............. 714/700 |
| 2002/0031042 A1 * | 3/2002 | Kim et al. ..................... 365/233 |

(Continued)

OTHER PUBLICATIONS

U.S. Appl. No. 10/809,658, filed Mar. 25, 2004, Tang.
U.S. Appl. No. 11/243,255, filed Oct. 4, 2005, Tang.
U.S. Appl. No. 11/346,817, filed Feb. 3, 2006, Chen et al.
U.S. Appl. No. 11/530,620, filed Sep. 11, 2006, Callahan et al.

(Continued)

*Primary Examiner* — M Elamin
(74) *Attorney, Agent, or Firm* — Haynes and Boone, LLP

(57) ABSTRACT

Systems and methods are disclosed herein to provide channel-to-channel skew control in accordance with one or more embodiments of the present invention. For example in accordance with an embodiment, a method of adjusting skew between first and second channels includes receiving a first channel output signal and a second channel output signal from the first and second channels, respectively; detecting a phase difference between the first channel output signal and the second channel output signal; and controlling, based on the detected phase difference, a signal delay within at least the first channel or the second channel to reduce skew between the first channel output signal and the second channel output signal.

8 Claims, 3 Drawing Sheets

U.S. PATENT DOCUMENTS

| | | |
|---|---|---|
| 2004/0061147 A1 | 4/2004 | Fujita |
| 2004/0064622 A1 | 4/2004 | Smith |
| 2004/0217789 A1 | 11/2004 | Kwak et al. |
| 2005/0132087 A1* | 6/2005 | Glinski et al. ............ 709/238 |
| 2006/0061401 A1* | 3/2006 | Shiratake et al. ........... 327/291 |
| 2007/0061607 A1* | 3/2007 | Carlson et al. ............. 713/503 |
| 2007/0118251 A1* | 5/2007 | Tseng et al. ............... 700/254 |
| 2009/0037758 A1* | 2/2009 | Carlson et al. ............. 713/401 |

OTHER PUBLICATIONS

U.S. Appl. No. 11/311,214, filed Dec. 19, 2005, Douglas Morse.
U.S. Appl. No. 11/332,986, filed Jan. 17, 2006, Nikolov et al.
U.S. Appl. No. 11/494,862, filed Jul. 28, 2006, Booth et al.
John G. Maneatis, Low-Jitter Process-Independent DLL and PLL Based on Self-Biased Techniques, IEEE Journal of Solid-State Circuits, vol. 31, No. 11, Nov. 1996, 10 pages.

* cited by examiner

CHANNEL-TO-CHANNEL DESKEW SYSTEMS AND METHODS

TECHNICAL FIELD

The present invention relates generally to electrical circuits and, more particularly, to clock systems and methods for electrical devices.

BACKGROUND

The skew between any two output channels (commonly referred to as parameter TSKEW) generally refers to the delay between the rising edge of an output clock signal on a first channel and the rising edge of an output clock signal on a second channel. Ideally, this delay should be zero when the phase-locked loop (PLL) or delay-locked loop (DLL) is in a locked operational state. However in reality, due for example to circuit non-idealities, the delay (e.g., parameter TSKEW) will typically never be zero.

A major contributor to the delay (e.g., phase error or skew) is often the mismatch (e.g., device mismatches, wiring mismatches, and/or lithography mismatches) between delays in the individual channels. It is generally preferred to reduce the delay to a minimal amount, but conventional approaches have various drawbacks. For example, one approach attempts to carefully match the different circuit paths and circuit elements across channels to reduce skew, but a significant amount of delay or skew typically remains between channels. As another example, trim circuits may be included to remove additional skew mismatch (e.g., adding or removing capacitance from nodes to increase or decrease delays), but this approach generally does not adequately track process, voltage, and temperature (PVT) conditions.

As a result, there is a need for improved techniques directed to channel-to-channel deskew.

SUMMARY

In accordance with one embodiment of the present invention, an integrated circuit includes at least a first channel and a second channel adapted to provide a corresponding first channel output signal and second channel output signal; a delay element disposed within at least one of the channels; and a control circuit adapted to receive the first channel output signal and the second channel output signal and to detect a phase difference between the first channel output signal and the second channel output signal, the control circuit further adapted to control the delay element based on the phase difference to reduce skew between the first channel output signal and the second channel output signal.

In accordance with another embodiment of the present invention, an integrated circuit includes a plurality of channels providing at least a first channel output signal and a second channel output signal; means for providing a selectable delay to the second channel output signal; means for detecting a phase difference between the first channel output signal and the second channel output signal; and means for controlling the providing means based on the detected phase difference to reduce skew between the first channel output signal and the second channel output signal.

In accordance with another embodiment of the present invention, a method of adjusting skew between first and second channels includes receiving a first channel output signal and a second channel output signal from the first and second channels, respectively; detecting a phase difference between the first channel output signal and the second channel output signal; and controlling, based on the detected phase difference, a signal delay within at least the first channel or the second channel to reduce skew between the first channel output signal and the second channel output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with one or more embodiments of the present invention, techniques are disclosed to reduce skew between channels (e.g., an automated method or automated calibration circuit). For example in accordance with an embodiment, skew between channels is reduced (e.g., a deskew operation) by sensing a phase difference between the channels with a phase detector, which may include the ability to reject noise (e.g., jitter) and/or hysteresis for stable results, and by adjusting a variable delay element to reduce the phase error between channels (e.g., to a minimal value or a desired value).

The skew reduction techniques may be applied, for example, continuously, periodically, or as a one-time or user requested calibration. For example for a calibration timing sequence that may operate in conjunction with an integrated circuit's PLL or DLL, the actual deskew operation may not occur until after internal lock (by the PLL/DLL) is achieved. As an example for low jitter applications (e.g., such as for a clock chip), the deskew calibration may be performed once at startup and then disabled until either a user request or another startup occurs.

For example in accordance with an embodiment, a skew control calibration circuit is disclosed that may be viewed as performing a DLL function during skew calibration. The skew control calibration circuit may be controlled (set), for example, to not compete or interfere with any other timing operation, while still allowing the calibration to be performed in a timely fashion and with suitable averaging or noise reduction performed for a desired application. As a specific example, a digital search method may be used that may converge to a zero delay difference solution for the skew calibration (e.g., a single LSB step at a time which may relax linearity requirements on the delay element).

As another example in accordance with one or more embodiments, the skew calibration technique (e.g., minimal or zero skew control/auto calibration technique) may use a finely controlled delay element to adjust individual channel delays such that the error or difference between the delays in any two channels may be reduced. For example, typical conventional delay adjustments may have a large variation over PVT, which may reduce the effectiveness of the calibration and compensation scheme. Consequently, to keep the delay controlled over PVT, ideally the delay element should be invariant to these changes and thus in accordance with some embodiments, by sensing a delay difference between any two channels (e.g., via a phase detector) and then by adjusting the delay elements, the channel to channel skew may be minimized. As discussed further herein, the skew calibration techniques may use a digital method or an analog method for calibration.

Figure 1:
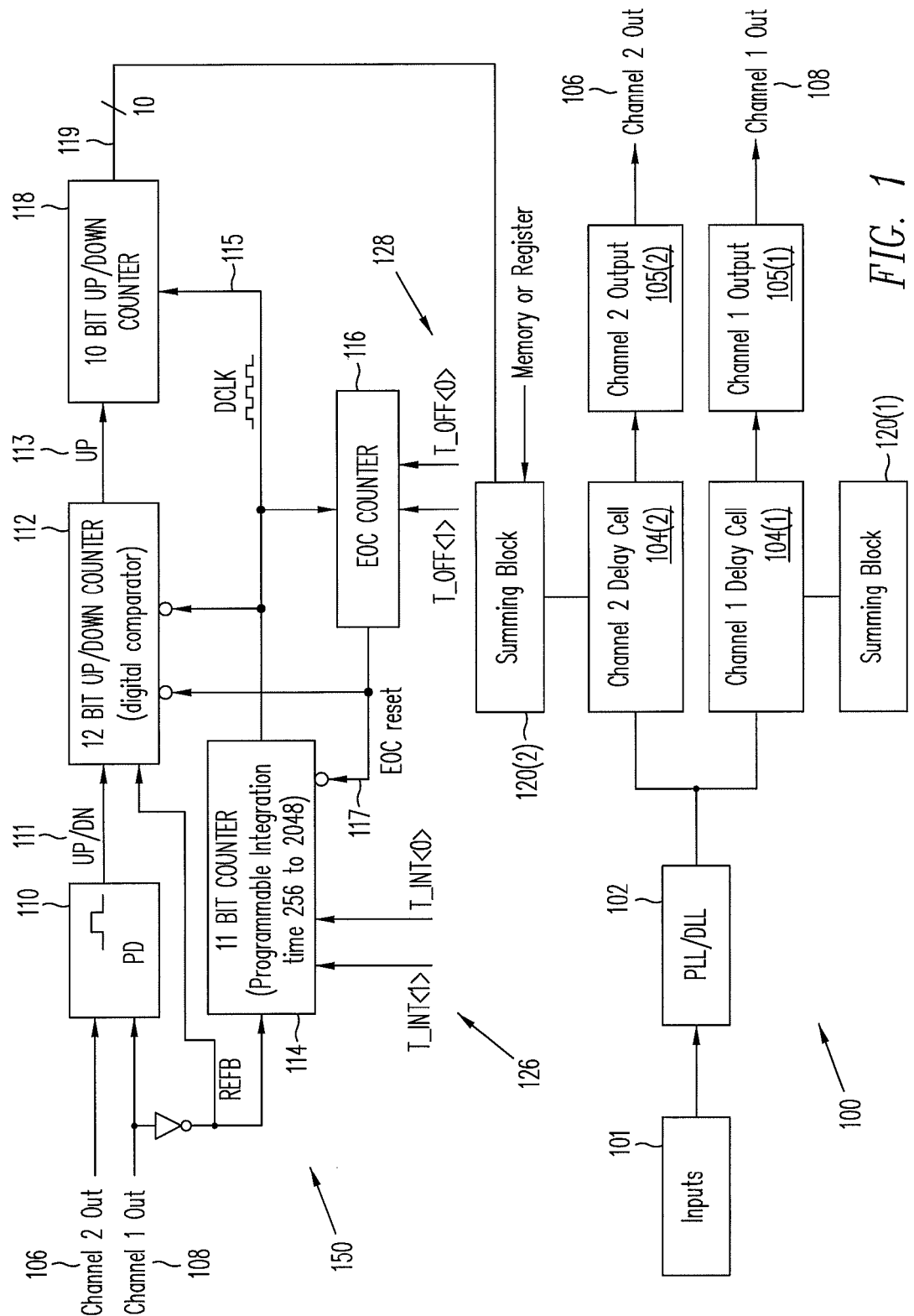
FIG. 1 shows a block diagram illustrating a skew control circuit for channels in accordance with an embodiment of the present invention.

For example, FIG. 1 shows a block diagram of a circuit 100, which illustrates a skew calibration circuit (e.g., minimal/zero skew calibration) and associated channel circuitry in accordance with an embodiment of the present invention. As an example, circuit 100 includes multiple channels having a PLL/DLL 102 for receiving input signals (represented by block 101) and channel output blocks 105(1), 105(2) for providing on a signal path 108 a channel 1 output signal and on a signal path 106 a channel 2 output signal. Furthermore for this example, circuit 100 includes a control circuit 150 for skew calibration of the multiple channels, which includes a phase detector (PD) 110, counters 112, 114, 116, and 118, and delay elements 104, with delay elements 104 within corresponding channels, as shown. In general, circuit 100 illustrates an exemplary implementation for control circuit 150 to provide skew (or deskew) calibration, with control circuit 150 also referred to herein as a zero skew calibration circuit and may be viewed as operating functionally to some extent as a second PLL/DLL (or some portion) within circuit 100.

PD 110 may be implemented, for example, as a fast lead-lag detector capable of resolving a small phase difference (e.g., 7-15 pS) between the channel 1 output signal and the channel 2 output signal (e.g., the two clock inputs to PD 110). When the channel 1 output signal is leading the channel 2 output signal, a PD output signal UP/DN on a signal path 111 is set to a logical high value. When the channel 1 output signal is lagging the channel 2 output signal, the output signal UP/DN is set or reset to a logical low value.

Counter 114 may be implemented as an integration time counter (e.g., an 11 bit counter having a programmable integration time from 256 to 2,048) to generate a clock DCLK on a signal path 115 for counters 112, 116, and 118. For example, the clock DCLK may be used to reset counter 112 (e.g., a 12 bit up/down counter/comparator) at the end of each integration period. As an example, the clock DCLK may be slower (e.g., 256 to 2,048 times slower) than the channel 1 output signal so that control circuit 150 (the additional loop) does not disturb the stability of PLL 102 (the main loop).

In general, as the optimal speed may depend on the particular settings of PLL 102, the frequency of the clock DCLK may be made programmable or selectable (e.g., controlled by hardware or software). As an example, counter 114, which may be implemented as a synchronous counter with a programmable division ratio, may be controlled as illustrated in Table 1 (for exemplary values) to select the desired integration period by control signals T_INT<1>, T_INT<0> on signal paths 126. For example, if circuit 100 is implemented within a programmable device (e.g., a programmable device such as a programmable logic device (PLD, e.g., a CPLD or an FPGA)), a programmable clock generator, or a programmable zero delay buffer), the frequency of the clock DCLK may be programmed (e.g., via the control signals T_INT<1>, T_INT<0>) by using the conventional software for programming such devices (e.g., programmable analog circuit (PAC) designer software by Lattice Semiconductor Corporation®) so that a desired integration period may be implemented (e.g., relative to other PLL/DLL settings within the integrated circuit).

TABLE 1

| T_INT [1] | T_INT [0] | Division Ratio |
|---|---|---|
| 0 | 0 | 256 |
| 0 | 1 | 512 |
| 1 | 0 | 1024 |
| 1 | 1 | 2048 |

PD 110 may register the sign of the phase error for every period of the channel 1 output signal. This information may be stored and processed (e.g., averaged over the entire integration/comparison period) by counter 112 (e.g., providing digital comparator functionality). Counter 112, for example, may be implemented as a 12-bit up-down counter clocked with the inverse of the channel 1 output signal and reset at the end of each integration period by the clock DCLK. The counting direction is controlled by the PD output signal UP/DN of PD 110. For example, if the PD output signal UP/DN is a logical high value (a "1" or HIGH), the counter value of counter 112 will be incremented, while if the PD output signal UP/DN is a logical low value (a "0" or LOW), the counter value of counter 112 will be decremented.

For example, in accordance with an embodiment of the present invention, counter 112 may be initially preset to 800 (Hex) (i.e., the MSB is set to 1). If within one integration period the PD output signal UP/DN of PD 110 provides a HIGH more often than a LOW, then there are more up counts than down counts and at the end of the integration period the MSB of counter 112 remains at 1. When the PD output signal UP/DN of PD 110 provides a LOW more often than a HIGH, then there are more down counts than up counts and at the end of the integration period the MSB of counter 112 changes to 0.

The final state of an output signal UP on a signal path 113 provided by counter 112 is determined by the state of the MSB, read at the end of each integration period or cycle, just before counter 112 is preset back to 800 (Hex). The output signal UP is used to control the count direction for counter 118 (e.g., a 10 bit up/down counter which may also be implemented as a DAC as described for example in U.S. Patent Publication No. 2007/0164798). For example, for every clock cycle of the clock DCLK (i.e., the integration clock cycle (DCLK)), the content of counter 118 is either incremented or decremented by one, depending on the state of the output signal UP from counter 112 (i.e., the direction of the output signal UP provided as an input to counter 118). As an example, counter 118 may be initially preset to 200 (Hex), which may represent a nominal or middle delay setting for delay elements 104. Furthermore as an example, the content of counter 118 may be summed with any user selectable setting (if desired) to set the desired delay, with one channel being the reference channel (e.g., channel 1 as shown in FIG. 1) and the other channel being the corrected channel (e.g., channel 2 as shown in FIG. 1).

The number of bits and the range of counter 118 may be determined by the expected maximum skew (e.g., worst case mismatch) between channels and the desired resolution of control circuit 150 (i.e., the control loop) and may further include any additional delay range desired (e.g., for other delay adjustments such as user control). For this particular exemplary implementation, in accordance with an embodiment of the present invention, an exemplary 10-bit counter 118 is illustrated, but this is not limiting and any desired number of bits and range for counter 118 may be implemented.

An optional feature that may keep the jitter level low is the dead band of counter 118 that prevents the output of counter 118 from wandering back and forth (i.e., ±LSB) when the average phase error is close to zero. For example, the 10-bit digital word provided by counter 118 via an output signal on a signal path 119 may be incremented or decremented only if the output signal UP stayed High or Low, respectively, for a given number of consecutive integration (comparison) periods (e.g., for two periods of the clock DCLK). Furthermore, the performance may optionally be improved by making the number of required consecutive integration periods programmable (e.g., 2, 4, or 8) and controlled by hardware or software (e.g., PAC designer software). In general, depending upon the fineness of the delay control, changes on the output signal of counter 118 may appear to look like deterministic jitter and thus, a dead band may prevent this from occurring (e.g., if skew control is in continuous operation mode).

In accordance with an embodiment of the present invention, one or more optional summing blocks 120 may be used to enable skew settings for each individual channel. For example in many applications, there may be a desire to have a fixed, accurate, and non-zero skew for a particular channel. After the zero skew calibration, this skew may be added into the zero calibration skew to generate a fixed, accurate and non-zero skew for that channel. However, if a fixed non-zero skew is used, the continuous method of adjustment is not possible for this implementation example as PD 110 will detect and try to adjust out the desired, fixed, non-zero skew delay.

The output from summing blocks 120 (or from counter 118) may be provided to delay elements 104 to provide the desired delay (e.g., fine delay) to minimize skew between channels. As an example, delay elements 104 may represent a delay element as discussed further herein (e.g., in reference to FIGS. 3 and 4) or may represent various conventional delay elements, such as a standard CMOS delay element (e.g., if the tracking over PVT is sufficient for the desired application) or an RC-type delay element (e.g., using MOS switches) or various other types or means of variable delay elements.

By default in accordance with an embodiment, control circuit 150 may run continuously to reduce the phase error (e.g., skew between channels), thus effectively compensating for various effects that may cause the phase error (e.g., temperature and supply variations). However, counter 116 may be provided to function as an end of correction (EOC) logic block (i.e., EOC signal generator) to switch off control circuit 150 after a certain period of time (e.g., the time needed for one calibration cycle) to completely eliminate any potential impact that control circuit 150 continuously running might have on the channels and circuit 100 (e.g., jitter performance of PLL 102).

As an example, the switch off time may be programmable and controlled by hardware or software (e.g., the PAC Designer software). For example, the switch off time may be set to 512, 1,024, or 2,048 periods of the clock DCLK (e.g., the integration/comparison clock) by control signals T_OFF<1>, T_OFF<0> on signal paths 128, as further illustrated in Table 2 (for exemplary values).

Counter 116 (EOC counter) may be implemented, for example, as a 10-bit asynchronous counter with a programmable division ratio to generate a control signal $EOC_{reset}$ on a signal path 117 to provide the EOC signal. When asserted, the control signal $EOC_{reset}$ (the EOC signal) disables all clock signals in control circuit 150 (e.g., the clock DCLK) and control circuit 150 may be placed in a reset or power down state (e.g., except for counter 118).

TABLE 2

| T_OFF [1] | T_OFF [0] | Division Ratio |
|---|---|---|
| 0 | 0 | N/A (Continuous) |
| 0 | 1 | 512 |
| 1 | 0 | 1024 |
| 1 | 1 | 2048 |

Optionally in accordance with an embodiment, the control signal $EOC_{reset}$ (the EOC signal) may further be used to control a PLL lock indicator. For example, as shown in Table 3, a control signal (CAL_LOCK) may be used to specify whether the PLL lock indicator operates normally or is gated by the control signal $EOC_{reset}$ (the EOC signal).

TABLE 3

| CAL_LOCK | PLL Lock Indicator |
|---|---|
| 0 | Normal Lock |
| 1 | Lock Gated By EOC |

In general, control circuit 150 functions to reduce skew between channels by controlling delay elements 104, while maintaining system stability, such as by minimizing its impact on jitter of PLL 102 or other variables. In this regard, various features of circuit 100 may be optimized to increase performance or minimize any undesirable effects. For example, control circuit 150 may be synchronized with the falling edge of the channel 1 output signal. Additionally, the skew compensation may begin only after PLL 102 is in a locked state and, at the end of each integration/comparison cycle (i.e., after each cycle of the clock DCLK), the output signal of counter 118 may change by only one LSB.

In accordance with one or more embodiments, control circuit 150 functions to deskew two channels, but the techniques disclosed herein may be applied for more than two channels, such as by repeating the pattern for each additional channel. As an example, one approach is to simply assume one channel as the correct delay (i.e., reference channel) and adjust all other channels based on this reference channel. The sequence may be serial, such as by adjusting the adjacent channel (Channel X) to the reference channel, then adjusting the Channel (X+1) to Channel X, and so on until all desired channels are adjusted. To keep errors to a minimum, a phase detector may be used between each adjacent channel, but depending on the specific application implementation, some parts of control circuit 150 may be time shared by all of the channels (e.g., except for delay elements 104 and summing blocks 120 which generally need to be done on a per channel basis) as would be understood by one skilled in the art.

More complex algorithms may be used to determine the correct delay setting, such as with a binary search for the correct setting. Furthermore, because information may be collected on the relationship between all channels, a more complex method of adjusting all channels and attempting to provide a better nominal setting, rather than arbitrarily using a single channel as reference, is also possible as would be understood by one skilled in the art. For example, a possible disadvantage of choosing a channel as a reference channel is that if this channel is near the edge of the control range of control circuit 150, this may result in pushing all channels close to the edge of the control range.

In accordance with some embodiments, skew calibration typically requires a common clock frequency or a known divide ratio between clock frequencies (e.g., if continuous operation is desired). For example for different clock frequencies, the output signal UP/DN of PD 110 may be blocked on non-coincident clock edges and only common clock edges used to determine skew between channels. As a further example, if a one-time calibration is required, the integrated circuit may be implemented to have a common clock frequency for calibration prior to switching to the divided clock frequencies. Alternatively as an example, the very final output stage (e.g., channel output blocks 105) may be implemented as high impedance (e.g., Hi-Z), with its pre-driver stage controlled (e.g., used as a delay element) to deskew the channels as would be understood by one skilled in the art. This may provide certain advantages, such as for an ASIC I/O having a pre-driver at a constant level and a constant load and thus, rise and fall times may be better matched and with the possibility of fewer reflections.

Furthermore in general, it may be advantageous to minimize the number of stages that are in the control loop (e.g., control circuit 150) and outside of the control loop. In general mismatch of stages and metal RC wiring result in some portion of the skew between channels. Thus for example, moving the correction to the output or final pre-driver may move all or most of the circuits within control for skew adjustments. Ideally as an example, PD 110 may be taped directly and not need level translators or other buffers (e.g., after the phase detection, the needs for matching of the control circuits may be minimal as the signal may be digitized and stored in flip flops or latches).

In accordance with an embodiment of the present invention, the monitoring, decision making, and control portions of control circuit 150 may be implemented as digital elements, which may allow a straightforward implementation and provide for the capability to port across different technologies. Furthermore, a digital implementation may provide a high level of insensitivity to variations and mismatches as well as the ability to easily reconfigure and customize. However, circuit 100 represents an example of a particular implementation and there are various other ways to adjust or change skew between channels that fall within the techniques disclosed herein.

Figure 2:
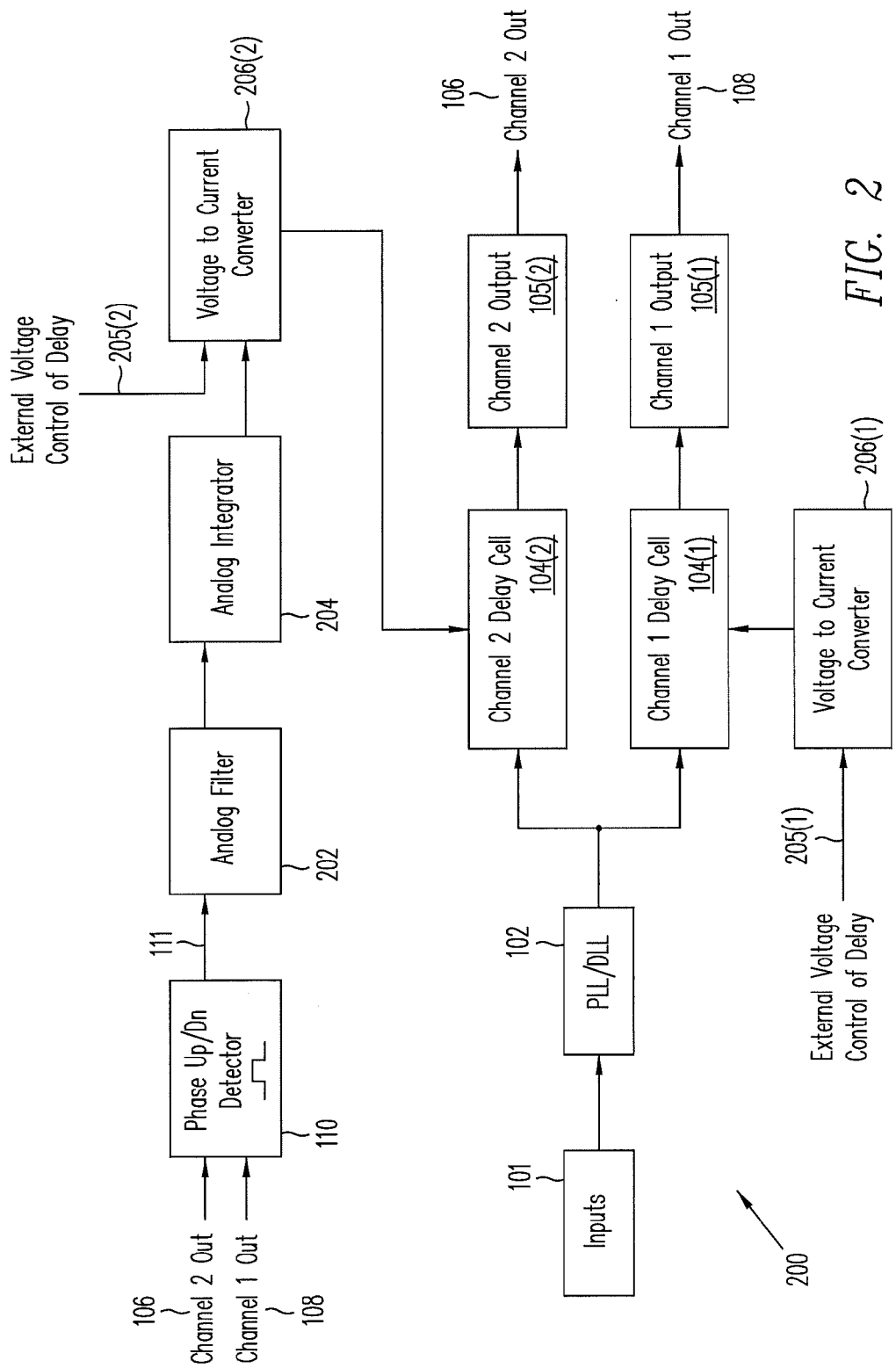
FIG. 2 shows a block diagram illustrating another implementation example of a skew control circuit for channels in accordance with an embodiment of the present invention.

For example in accordance with one or more embodiments, an analog version may be implemented as illustrated in FIG. 2, which shows a block diagram of a circuit 200 having a skew calibration circuit and associated channel circuitry in accordance with an embodiment of the present invention. For this specific example, the output signal UP/DN of PD 110 may be viewed as representing a weighted bit stream of the matching between channels. The output signal UP/DN may be filtered (e.g., by an analog filter 202, such as a first order RC filter) to obtain a DC value, which may represent the degree of skew between the two channels.

For example, the voltage swing (Vd) of PD 110 divided by two may represent the nominal zero phase value, which may be provided to an integrator 204 that drives (e.g., via voltage-to-current converters 206 controlled by control signals on signal paths 205(1), 205(2)) an analog variable delay section (e.g., delay elements 104) that adjusts the delay either up or down depending on the output voltage value of PD 110. Voltage-to-current converters 206 may be implemented, for example, if delay elements 104 require currents rather than voltages (e.g., CMOS-based delay elements).

Figure 3:
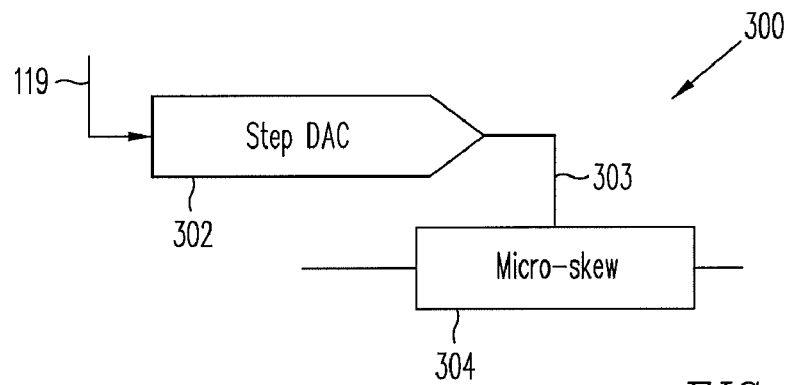
FIG. 3 shows a block diagram illustrating an exemplary circuit implementation for a portion of FIG. 1 in accordance with an embodiment of the present invention.

As noted previously in reference to FIGS. 1 and 2, delay element 104 may be controlled by means such as control circuit 150 to provide a desired delay (e.g., fine delay) for a corresponding channel and skew calibration relative to another channel. As an example, FIG. 3 shows a block diagram illustrating a circuit 300, which is an implementation example for one delay element 104 in accordance with an embodiment of the present invention. Circuit 300 includes a digital-to-analog converter (DAC) 302 and a delay element 304 (e.g., referred to herein as a micro-skew delay element for providing fine delay). It should be understood that DAC 302 may be optional, depending upon the specific implementation, as would be understood by one skilled in the art.

DAC 302 receives the output signal from counter 118 (or output signal from summing block 120) and provides control signals on a signal path 303 to delay element 304. Delay element 304 receives output signals from PLL 102 and provides a delayed output signal (e.g., to channel output block 105) based on the control signals on signal path 303.

Delay element 304 may provide, for example, very fine delay element control (e.g., also referred to herein as micro-skew control) within an integrated circuit, such as clock generator and buffer circuits (e.g., any type of integrated circuit). The fine delay may provide incremental delay steps that are much smaller than could be provided by conventional techniques. Furthermore, the delay technique may provide one or more delays that are PVT independent and programmable.

Figure 4:
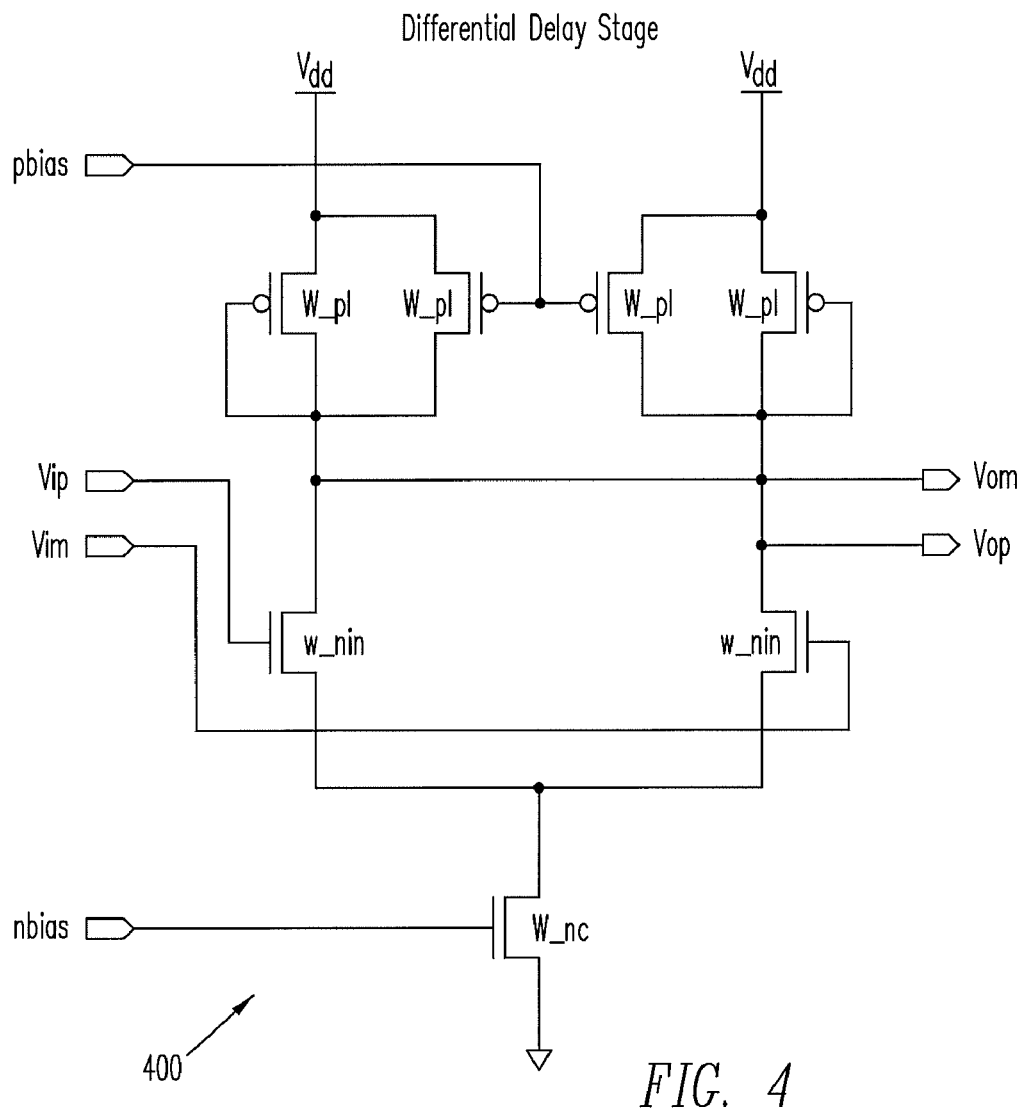
FIG. 4 shows a block diagram illustrating an exemplary circuit implementation for a portion of the circuit of FIG. 3 in accordance with an embodiment of the present invention.

As an example, FIG. 4 shows a block diagram illustrating a circuit 400, which is an implementation example for delay element 304 of FIG. 3 in accordance with an embodiment of the present invention. Specifically as an example, circuit 400 shows an exemplary differential delay stage that receives control signals (e.g., pbias and nbias) from DAC 302 and differential input signals (e.g., Vip and Vim) from PLL 102 and provides differential output signals (Vom and Vop) to channel output blocks 105.

Systems and methods are disclosed herein to provide channel-to-channel skew control (e.g., deskew calibration) in accordance with one or more embodiments of the present invention. For example, in accordance with an embodiment of the present invention, an automated, digital, channel-to-channel deskew (e.g., on-chip and precision) technique is disclosed for PLL/DLL based clock chips. As a specific example, an automatic compensation circuit is disclosed that may reduce a phase delay or error between channels due output driver block mismatches or other factors. Thus, the skew matching of the delay paths (e.g., from PLL/DLL output to pad) may be ideally guarantied by design.

The techniques disclosed herein may provide for an automated correction for small delay differences between channels, may provide the ability to reject noise or jitter, may include hysteresis to avoid adding jitter to critical outputs, may make use of a precision delay cell, may provide the ability to be used in multiple modes (e.g., continuous, one-time, or user requested), and/or may provide the ability to correct multiple channels (e.g., to the same minimal or zero delay). Furthermore, the techniques disclosed herein may be applied to a variety of integrated circuits, including non-programmable and programmable devices. For example, circuits 100 and 200 may each represent an integrated circuit, such as an ASIC or a programmable device.

Embodiments described above illustrate but do not limit the invention. It should also be understood that numerous modifications and variations are possible in accordance with the principles of the present invention. Accordingly, the scope of the invention is defined only by the following claims.

What is claimed is:

1. An integrated circuit comprising:
   at least a first channel and a second channel adapted to provide a corresponding first channel output signal and second channel output signal;
   a delay element disposed within at least one of the channels; and
   a control circuit adapted to receive the first channel output signal and the second channel output signal and to detect a phase difference between the first channel output signal and the second channel output signal, the control circuit further adapted to control the delay element based on the phase difference to reduce skew between the first channel output signal and the second channel output signal,
   wherein the control circuit includes:
      a phase detector adapted to receive the first channel output signal and the second channel output signal and provide a phase detector output signal;
      a first counter adapted to receive the phase detector output signal and provide a first counter output signal based on the phase detector output signal; and
      a second counter adapted to receive the first counter output signal and provide a second counter output signal to control the delay element based on the first counter output signal to reduce skew between the first channel output signal and the second channel output signal.

2. The integrated circuit of claim 1, wherein the control circuit comprises:
   a third counter adapted to receive the first channel output signal and provide a control circuit clock having a lower frequency than a frequency of the first channel output signal, wherein the first counter and the second counter are clocked by the control circuit clock.

3. The integrated circuit of claim 2, wherein the control circuit further comprises a fourth counter adapted to receive the control circuit clock and provide an end of correction signal after a certain time period to stop further modifications to the delay element by the control circuit.

4. The integrated circuit of claim 3, wherein the time period to stop further modifications to the delay element is programmable and wherein the frequency of the control circuit clock is programmable.

5. An integrated circuit comprising:
   at least a first channel and a second channel adapted to provide a corresponding first channel output signal and second channel output signal;
   a delay element disposed within at least one of the channels; and
   a control circuit adapted to receive the first channel output signal and the second channel output signal and to detect a phase difference between the first channel output signal and the second channel output signal, the control circuit further adapted to control the delay element based on the phase difference to reduce skew between the first channel output signal and the second channel output signal,
   wherein the control circuit comprises:
      a phase detector adapted to receive the first channel output signal and the second channel output signal and provide a phase detector output signal;
      a filter adapted to receive the phase detector output signal and provide a first filtered output signal based on the phase detector output signal; and
      an integrator adapted to receive the first filtered output signal and provide an integrated output signal to control the delay element based on the first filtered output signal to reduce skew between the first channel output signal and the second channel output signal.

6. The integrated circuit of claim 5, wherein the control circuit further comprises a voltage-to-current converter to convert the integrated output signal.

7. The integrated circuit of claim 1, wherein the delay element comprises a differential delay stage circuit.

8. The integrated circuit of claim 1, wherein a frequency of adjustments to the delay element by the control circuit is programmable by selecting a desired number of successive integration cycles.

* * * * *